United States Patent
Klassen et al.

(10) Patent No.: US 6,776,464 B2
(45) Date of Patent: Aug. 17, 2004

(54) SWITCHGEAR CABINET INCLUDING FRAMEWORK AND COVERING MEMBERS

(75) Inventors: Samuel Klassen, Haiger (DE); Heiko Holighaus, Eschenburg (DE)

(73) Assignee: Rittal RCS Communication Systems GmbH & Co. KG, Haiger (DE)

(*) Notice: Subject to any disclaimer, the term of this patent is extended or adjusted under 35 U.S.C. 154(b) by 38 days.

(21) Appl. No.: 10/102,178

(22) Filed: Mar. 20, 2002

(65) Prior Publication Data

US 2002/0167251 A1 Nov. 14, 2002

(30) Foreign Application Priority Data

Mar. 21, 2001 (DE) .......................................... 101 13 893

(51) Int. Cl.⁷ .............................................. A47B 47/00
(52) U.S. Cl. .................................................. 312/265.1
(58) Field of Search .......................... 312/265.1, 265.2, 312/265.3, 265.4, 257.1, 265.5, 326, 329; 211/182, 183, 189, 26; 361/829; 49/397, 398

(56) References Cited

U.S. PATENT DOCUMENTS

| | | | | |
|---|---|---|---|---|
| 5,772,296 A | * | 6/1998 | Hartel et al. | 312/265.1 |
| 5,775,051 A | * | 7/1998 | Nicolai et al. | 52/731.1 |
| 5,930,972 A | * | 8/1999 | Benner et al. | 52/653.1 |
| 5,971,511 A | * | 10/1999 | Diebel et al. | 312/265.3 |
| 5,992,646 A | * | 11/1999 | Benner et al. | 211/26 |
| 6,030,063 A | * | 2/2000 | Benner | 312/265.1 |
| 6,120,206 A | * | 9/2000 | Benner et al. | 403/231 |
| 6,273,533 B1 | * | 8/2001 | Nicolai et al. | 312/265.1 |

FOREIGN PATENT DOCUMENTS

EP 751595 A2 * 1/1997 ............ H02B/1/30

* cited by examiner

Primary Examiner—James O. Hansen
(74) Attorney, Agent, or Firm—Pauley Petersen & Erickson

(57) ABSTRACT

A switchgear cabinet including rectangular frameworks of frame members, wherein, in the region of the outer corner edges, free spaces are formed for the accommodation of angled edges of the double-wall covering members, which are juxtaposed each other. At least one covering member is configured as a cabinet door, which has hinges on the framework, which is pivotally mounted with hinges and which is closable and openable by closure members on the framework. If the covering members and the cabinet doors have an interior wall and an exterior wall, the formed cavity extending at least partially over the free space of the associated vertical frame member, in the case of the cabinet doors, in the region of the covered free space, the cavity receives hinged members on the one vertical side and closure members on the opposite side. Counter-hinged members and counter-closure members are mounted on the framework, the coupling points of the hinged members and counter-hinged members being inside or outside the cavity of the cabinet door and the engagement points of the closure members and counter-closure members being in the cavity of the cabinet door, and thus precisely in the region of the hinging side and closure side of the cabinet door, safety against vandalism is improved.

15 Claims, 1 Drawing Sheet

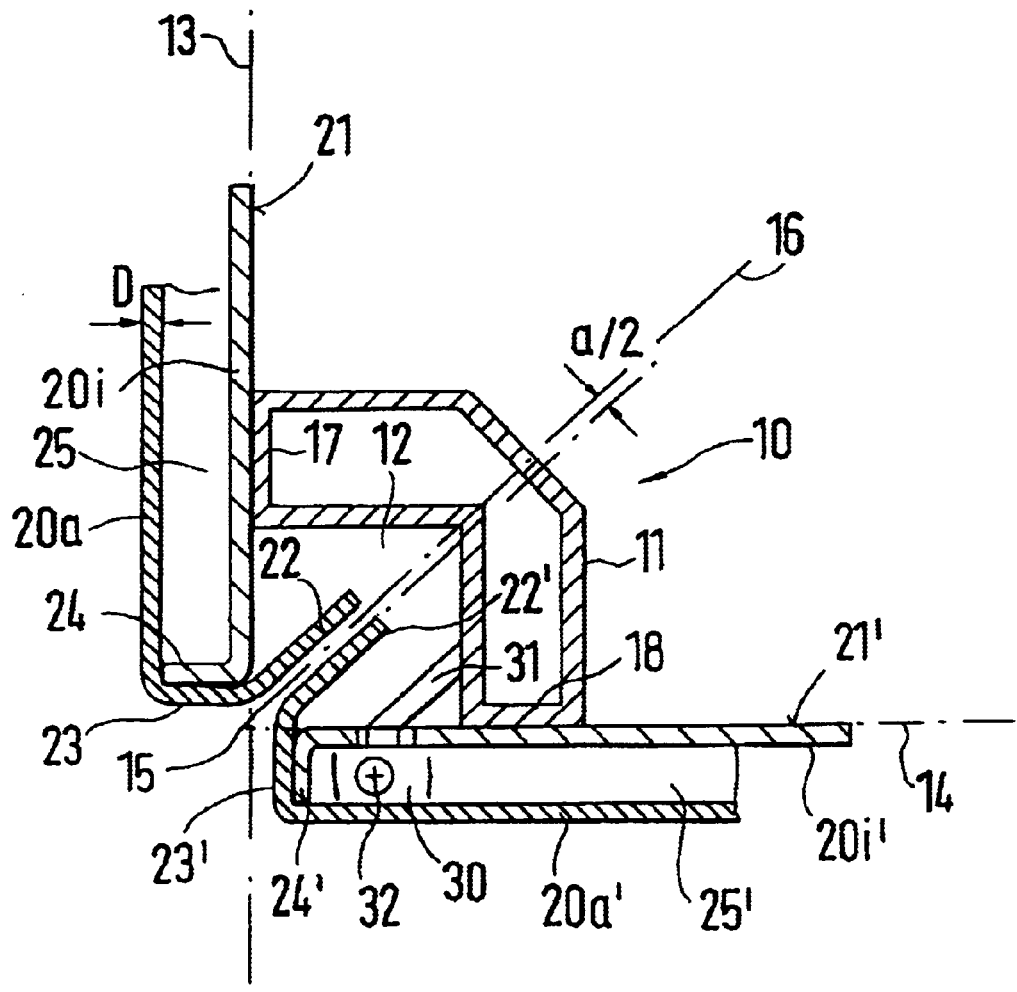

SWITCHGEAR CABINET INCLUDING FRAMEWORK AND COVERING MEMBERS

BACKGROUND OF THE INVENTION

1. Field of the Invention

This invention relates to a switchgear cabinet including rectangular framework including frame members, wherein, in a region of the outer corner edges, free spaces are formed for the accommodation of angled edges of double-wall covering members, which are juxtaposed each other, and at least one covering member is configured as a cabinet door which is pivotally mounted on the framework by hinges and which is closable and openable by closure members on the framework.

2. Description of Related Art

Switchgear cabinets are preferably used outside and increased attention to security against unauthorized opening of the switchgear cabinets is required. A double-wall covering makes a forcible attack on the cabinet more difficult. Security against vandalism in the region of the hinging and closure side of the cabinet door is not always sufficient, as often access to the hinge and the closure is provided.

SUMMARY OF THE INVENTION

It is one object of this invention, with a switchgear cabinet of the type described, to improve the hinge and the closure of the cabinet door so that security against the forcible opening is increased in these places without restricting the arbitrary combination of covering members and cabinet doors on the framework.

This object is achieved according to this invention, with the covering members and the cabinet doors having an interior wall and an exterior wall, the formed cavity extending at least partially over a free space of the associated vertical frame member. In the region of the covered free space, the cavity receives hinged members on the one vertical side, and closure members on the opposite side. Counter-hinged members disposed on the framework and counter-closure members are provided and the hinging points are disposed inside or outside the cavity of the cabinet door and the closure points are always disposed inside the cavity of the cabinet door.

With the hinged members and closure members as well as the hinging points and the closure points inside and outside the cavity of the cabinet door, access to the vertical points of the hinging and of the closure of the cabinet door is made practically impossible and thus security against vandalism is improved. The counter-hinged members and the counter-closure members are fixedly attached on the framework and are also covered by the cabinet door.

In many cases it can be sufficient for the exterior walls of the covering members and the cabinet door, at least on their vertical sides, to be angled over the vertical sides of the interior walls and to extend with an angled end portion into the free space of the facing, vertical frame member of the framework. For the desired, increased security, the horizontal and vertical covering members and the cabinet doors are angled and configured in the same way on the horizontal and vertical sides as well as are orientated relative to the facing frame members.

The angled end portions can extend parallel to the angle bisector between the outer planes of the framework, which are juxtaposed each other at right angles in the region of the vertical frame member, and are at a pre-determined spacing from the planes, access to the inside of the internal wall of the switchgear cabinet then becomes even more difficult.

A possibility for developing the regions of the outer edge corners is for the exterior walls of the covering members and of the cabinet doors to merge into the angled end portions via a transition portion, which is angled at a right angle or at an obtuse angle in the direction towards the associated interior wall.

A defined stop position of the closed cabinet door is obtained because the inside of the interior wall of the closed cabinet door lies in the facing outer plane of the framework.

To prevent a tool from being placed in the region of the gap between the covering members, which are juxtaposed each other at a right angle, including the cabinet doors, the pre-determined spacing between the outsides of the angled end portions and the facing angle bisector is smaller than the thickness of the interior walls and exterior walls.

The connection between the interior wall and the exterior wall of a covering member or of the cabinet door is simplified because the interior walls, at least on their vertical sides, have angled edges, which abut the insides of the transition portions of the exterior walls and are connected thereto, for example welded.

BRIEF DESCRIPTION OF THE DRAWING

This invention is described in view of a drawing which shows a cross section of a horizontal fragmentary view taken through one corner of a rectangular framework of the corner where the door side is hinged to a corner formed by two adjacent rectangular frames.

DESCRIPTION OF PREFERRED EMBODIMENTS

A horizontal cross-section taken through the outer edge corner 15 with the hinging side of the cabinet door according to the drawing shows, with the dot-dash line 13 and 14, the outer planes of the framework 10, which intersect at the outer edger corner 15. The outer planes 13 and 14 are defined by the outer sides of the abutment profile sides 17 and 18. The covering member with the interior wall 20$i$ and the exterior wall 20$a$ is mounted on the abutment profile side 17. The vertical side of the exterior wall 20$a$ shown is double angled, as shown by the transition portion 23 and the angled end portion 22. The angled portion 22 surrounds the vertical end of the interior wall 20$i$, which is angled outwardly, as shown by edge 24. The edge 24 abuts the inside of the transition portion 23 and is connected thereto, for example, is welded. In the embodiment shown, the transition portion 23 is at a right angle to the exterior wall 20$a$ and the angled end portion 22 is at an angle of 135° to the transition portion 23. The angled end portion 22 extends, consequently, parallel to the angle bisector 16 between the outer planes 13 and 14. In addition, the outside of the angled end portion 22 is at a predetermined spacing a/2 from the angle bisector 16. The interior wall 20$i'$ and the exterior wall 20$a'$ of the cabinet door are also designed and interconnected in the same way. With the cabinet door in the closed position, there is a gap between the angled end portions 22 and 22', which extend into the free space 12 of the frame member 11 of the framework 10, which gap has a width a preferably chosen smaller than the thickness D of the interior walls 20$i$ and 20$i'$ and the exterior walls 20$a$ and 20$a'$ used for the covering members and the cabinet door.

The transition portions 23 and 23' can also be at an obtuse angle to the insides 21 and 21' and can even include several portions. The cavities 25 and 25' of the covering members and the cabinet door extend beyond the system profile sides 17 and 18 over the largest portion of the free space 12 of the frame member 11. Hinged members 30 are mounted in the overlapping region of the cavity 25'. The interior wall 20i' has openings, through which the counter-hinged members 31 are introduced into the cavity 25' and are pivotably connected to the hinged members 30. This is indicated by the hinging axis 32, so that the coupling points are not accessible. In addition, with the cabinet door in the closed position, access to the free space 12 and, consequently, to the inside of the interior walls 20i and 20i', is more difficult because of the angled end portions 22 and 22'.

The coupling points between the hinged members 30 and the counter-hinged members 31 can also lie outside the cabinet doors in the free space 12 of the associated frame member 11.

The width a of the gap and the length of the angled end portions 22 and 22' are determined in conjunction with the arrangement of the hinging axis 32, so that the cabinet door obtains a sufficiently large angle of opening.

On the opposite vertical closure side of the cabinet door, closure members and counter-closure members are mounted, in the same way, in the cavity 25' of the cabinet door and on the facing frame member and their contact points are sited in the cavity of the cabinet door.

The horizontal sides of the covering members and the cabinet door can also be designed in the same way, so that the cross-section through the horizontal outer edge corners corresponds essentially to the cross-section illustrated in the drawing. The sides of the covering member and of the cabinet door can also have ventilation apertures in the angled portions of the exterior walls or they can be open, without angled portions.

The frame members 11 can also have other cross-sections, however, they are preferably mirror-inverted relative to the angle bisector 16. The angled end portions 22' at least of the cabinet door can also be shorter than the angled end portions 22 of the covering members so as to increase the angle of opening of the cabinet doors.

German Patent Reference 101 13 93.8, the priority document corresponding to this invention, and its teachings are incorporated, by reference, into this specification.

We claim:

1. In a switchgear cabinet having a rectangular framework of frame members wherein in a region of outer edge corners free spaces are formed for accommodation of angled edges of double-wall covering members, which are juxtaposed each other, and wherein at least one covering member is configured as a cabinet door, which has hinges on the framework, which is pivotally mounted with the hinges and which is closable and openable again by closure members on the framework, the improvement comprising:

the covering members and the cabinet doors having an interior wall (20i or 20i') and an exterior wall (20a or 20a'), a formed cavity (25, 25') extending at least partially over the free spaces (12) of an associated vertical frame member (11), in the region of the covered free space (12) the cavity (25) receiving hinged members (30) on one vertical side and closure members on an opposite side, counter-hinged members (31) disposed on the vertical frame member (11), and counter-closure members provided so that hinging points (32) are inside the cavity (25') of the cabinet door, and the closure points are inside the cavity (25') of the cabinet door.

2. In the switchgear cabinet according to claim 1, wherein the exterior walls (20a, 20a') of the covering members and of the cabinet door at least on the vertical sides are angled over the vertical sides of the interior walls (20i, 20i') and extend with an angled end portion (22, 22') into one of the free spaces (12) of the vertical frame member (11) of the framework (10).

3. In the switchgear cabinet according to claim 2, wherein the angled end portions (22, 22') extend parallel to an angle bisector (16) between outer planes (13, 14) of the framework (10) which are juxtaposed each other at right angles in the region of the vertical frame member (11), and are at a predetermined spacing (a/2) from the outer planes (13, 14).

4. In the switchgear cabinet according to claim 3, wherein the exterior walls (20a, 20a') of the covering members and of the cabinet doors merge into the angled end portions (22, 22') via a transition portion (23, 23') which is angled at one of a right angle and an obtuse angle in a direction towards the associated interior wall (20i, 20i').

5. In the switchgear cabinet according to claim 4, wherein the inside (21') of the interior wall (20i') of the closed cabinet door lies in the facing outer plane (14) of the framework (10).

6. In the switchgear cabinet according to claim 5, wherein the predetermined spacing (a/2) between the outsides of the angled end portions (22, 22') and the facing angle bisector (16) is smaller than a thickness (D) of the interior and exterior walls (20i, 20i' and 20a, 20a').

7. In the switchgear cabinet according to claim 6, wherein the interior walls (20i, 20i'), at least on the vertical sides, have angled edges (24, 24') which abut an inside of the transition portion (23, 23') of the exterior wall (20a, 20a') and are connected to the exterior wall (20a, 20a').

8. In the switchgear cabinet according to claim 7, wherein all of the horizontal and vertical covering members and the cabinet doors are angled and configured in a same way on the horizontal sides and the vertical sides and are orientated relative to the facing frame members (11).

9. In the switchgear cabinet according to claim 8, wherein the angled end portions (22, 22') of the covering members and the cabinet doors (20, 20') at free ends are bent inwardly in a direction towards the insides (21, 21') of the associated interior walls (20i, 20i').

10. In the switchgear cabinet according to claim 1, wherein the exterior walls (20a, 20a') of the covering members and of the cabinet doors merge into angled end portions (22, 22') via a transition portion (23, 23') which is angled at one of a right angle and an obtuse angle in a direction towards the associated interior wall (20i, 20i').

11. In the switchgear cabinet according to claim 1, wherein the inside (21') of the interior wall (20i') of the closed cabinet door lies in a facing outer plane (14) of the framework (10).

12. In the switchgear cabinet according to claim 1, wherein a predetermined spacing (a/2) between the outsides of the angled end portions (22, 22') and the facing angle bisector (16) is smaller than a thickness (D) of the interior and exterior walls (20i, 20i' and 20a, 20a').

13. In the switchgear cabinet according to claim 1, wherein the interior walls (20i, 20i'), at least on the vertical sides, have angled edges (24, 24') which abut an inside of the transition portion (23, 23') of the exterior wall (20a, 20a') and are connected to the exterior wall (20a, 20a').

14. In the switchgear cabinet according to claim 1, wherein all of the horizontal and vertical covering members and the cabinet doors are angled and configured in a same way on the horizontal sides and the vertical sides and are orientated relative to the facing frame members (11).

15. In the switchgear cabinet according to claim 1, wherein the angled end portions (22, 22') of the covering members and the cabinet doors (20, 20') at free ends are bent inwardly in a direction towards the insides (21, 21') of the associated interior walls (20i, 20i').

* * * * *